United States Patent [19]

Aigo

[11] Patent Number: 4,677,758

[45] Date of Patent: Jul. 7, 1987

[54] SPIN DRIER FOR SEMICONDUCTOR MATERIAL

[76] Inventor: Seiichiro Aigo, 3-15-13, Negishi, Daito-ku, Japan

[21] Appl. No.: 784,569

[22] Filed: Oct. 4, 1985

[51] Int. Cl.[4] .............................................. F26B 11/18
[52] U.S. Cl. ....................................... 34/58; 279/1 C; 279/33
[58] Field of Search .................. 279/1 C, 33; 34/8, 58

[56] References Cited

U.S. PATENT DOCUMENTS 4,313,266  2/1982  Tam ........................................ 34/58

FOREIGN PATENT DOCUMENTS 9335  3/1956  Fed. Rep. of Germany ...... 279/1 C

*Primary Examiner*—Larry I. Schwartz
*Attorney, Agent, or Firm*—Wegner & Bretschneider

[57] ABSTRACT

Disclosed herein is a spin drier for semiconductor material including a vertical shaft, a table located on the top of the shaft, support members for supporting thereon a semiconductor material, holding members for holding the outer periphery of the supported semiconductor material, and three or more chuck members, each said chuck member having a pin passing through the table, a chuck part mounted on the top of the pin, a weight eccentrically attached to the pin and a spring member for restoring the chuck part to a determined non-chuck position, whereby in rotation the weight is shifted to a radially outer position due to centrifugal force to thereby move the chuck part radially inwardly to hold upper surface portions of the outer periphery of the supported semiconductor material.

8 Claims, 9 Drawing Figures

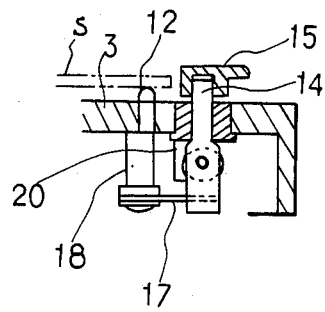
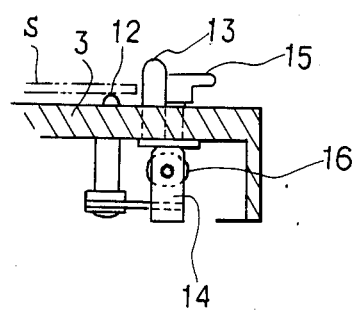
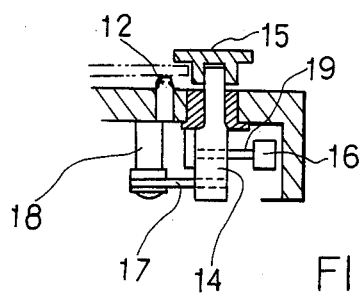
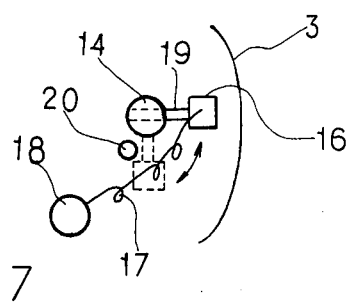
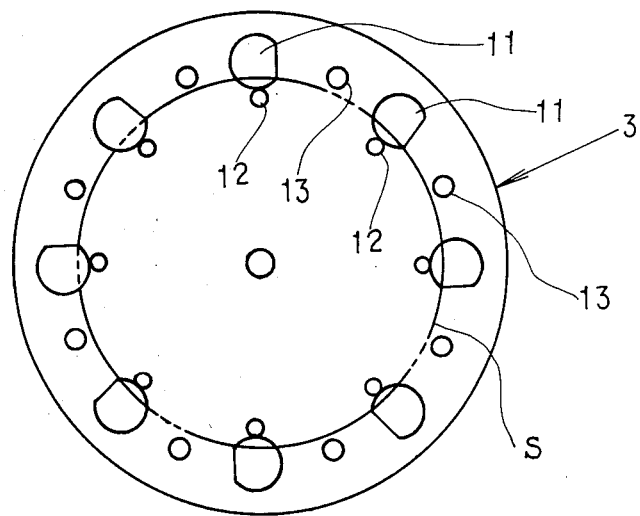

SPIN DRIER FOR SEMICONDUCTOR MATERIAL

BACKGROUND OF THE INVENTION (1) Field of the Invention

This invention relates to an improvement in or relating to an apparatus adapted to remove water droplets stuck on the surfaces of a thin-plate shaped semiconductor material, one by one, such as silicon wafer or glass photomask by a centrifugal force and to spin-dry the same.

(2) Description of Prior Art

Formation of wiring or circuits on a semiconductor material is accomplished by etching. After such etching, the semiconductor material is washed with pure water and thereafter the material is rotated to remove water droplets thereon and to dry the same. Conventionally, in a process of spin-drying the semiconductor material, such material to be dried is being sucked to a vacuum suction head which is located at an end of a rotary hollow shaft. Accordingly, such prior art spin drier requires a vacuum unit and switch valves besides a rotary drive unit. This complicates the mechanism and operation of the spin drier, and provides a disadvantage in that only one surface of the material is dried.

SUMMARY OF THE INVENTION

An object of the invention is to provide a spin drier for semiconductor material, which enables an easy setting and removal of a semiconductor material with a simple mechanism, and spin-dries both surfaces of the same.

In order to achieve the above object, main feature of the present invention resides in that three or more chuck members are disposed at peripheral portions of a rotary support table to hold peripheral portions of a semiconductor material supported on the table, due to a centrifugal force upon rotation of the table.

Therefore, the present invention provides a spin drier comprising a vertical shaft rotatably mounted within a housing; a horizontal rotary table located on the top of the shaft; support members positioned in the table and upwardly projecting from the table surface for supporting thereon a semiconductor material; holding members to be contacted with the outer periphery of the supported semiconductor material on the table; three or more chuck members for holding upper surface portions of the outer periphery of the supported semiconductor material; each chuck member having a pin which passes through the table, a chuck part mounted on the top of said pin for holding a semiconductor material supported on the table against any rise thereof, a weight eccentrically attached to said pin under the table, and a spring member for restoring said chuck part in non-rotating condition to a determined angular position where said chuck part does not hold the semiconductor material.

The above and other objects, features and advantages of the present invention will become apparent from the following description and the appended claims, taken in conjunction with accompanying drawings.

BRIEF DESCRIPTION OF THE DRAWINGS

FIG. 3 is an enlarged sectional view of a portion shown by A in FIG. 1;

FIG. 4 is a sectional view taken along line B—B in FIG. 2;

FIG. 5 is a sectional view similar to FIG. 3, showing a condition in which a semiconductor material supported on the table is held;

FIG. 6 is a bottom view of a portion shown in FIG. 5;

FIG. 7 is a top plan view showing a condition of chuck members in which a semiconductor material is held;

DETAILED DESCRIPTION OF THE INVENTION AND PREFERRED EMBODIMENTS

Figure 1:
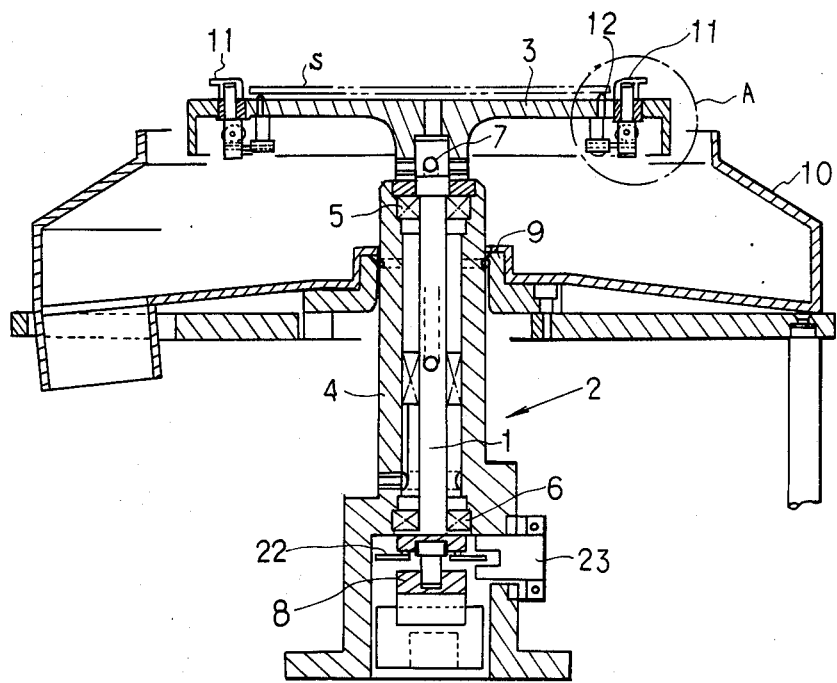
FIG. 1 is a vertical cross-sectional view of a spin drier showing an embodiment of the invention.
Figure 2:
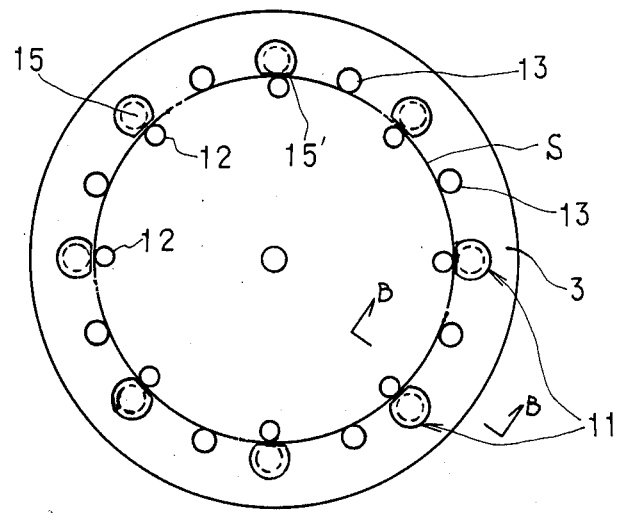
FIG. 2 is a top plan view of the primary members included in the spin drier shown in FIG. 1.

As illustrated in FIGS. 1 and 2 which show the entirety of a spin drier embodied by the present invention, this spin drier is arranged with a vertical rotary shaft 1, a support body 2 for supporting rotatably the shaft 1 and a horizontal rotary table 3 mounted on the top of the shaft 1. The shaft 1 is driven by an electric motor (not shown) through a suitable transmission device. Normally, the shaft 1 will be driven at 1000–8000 revolutions per minute (r p m).

Support body 2 consists of a vertical housing 4 which supports the shaft 1 by means of a pair of bearings 5 and 6. Numeral 7 denotes a pin fixing the table 3 on the top portion of shaft 1. 8 denotes a coupling which serves to connect the shaft 1 with a rotating axis provided thereunder. Housing 4 has a cup-base 9 at its upper portion. Mounted on the cup-base 9 is an inner cup casing which surrounds the outer periphery and lower portion of the table 3. There will be provided a slit-plate 22 and a rotary sensor 23 relevant to the shaft 1.

Rotary table 3 is a disk shaped member as seen in FIG. 2, and has at least three, preferably eight chuck members 11 as shown, rotatably mounted thereon. These chuck members are preferably equally spaced on the peripheral portion as shown in FIG. 2. Also, a suitable number of support members 12 are disposed in the peripheral section of table 3, preferably equally spaced, to support a semiconductor material thereon. Furthermore, holding members 13 are provided in the peripheral section of table 3. These holding members 13 are adapted to be contacted with the outer periphery of a semiconductor material to thereby hold the same. Preferably, support members 12 and holding members 13 are pins. Also, although these members 11, 12 13 may be made of any suitable material, they are preferably made of a resin such as teflon or the like. Needless to say, the tops of the support members 12 are of the same height.

As shown in FIGS. 3 and 4, each chuck member 11 includes a pin 14 passing through the table 3 with a suitable fit for rotation, a chuck part 15 mounted on the top of the pin 14, a weight 16 eccentrically attached to the pin 14 under the table 3 and a spring 17 for restoring the chuck part 15 to a determined angular position. 18 denotes a spring holder to support the spring 17. The spring 17 will be a coil spring or a leaf spring. Weight 16 is desirably mounted on free end of a pin 19 or a screw rod perpendicularly attached to the through-pin 15 as shown in FIG. 6. In the shown embodiment, chuck part 15 consists of a disk formed with a chordal notch 15'.

There is also provided a stopper 20 adjacent a corresponding chuck member 11 for positioning the same to a non-chuck location in which the chuck part 15 does not hold a semiconductor material.

In a condition as shown in FIGS. 1, 2 and 3 in which centrifugal force does not act, the respective chuck members 11 are held in a determined position by means of spring 17 and stopper 20, in which the notch 15' of chuck part 15 is oriented to the center of table 3. In this condition, a semiconductor material S will be arbitrarily set on the table 3 and also removed therefrom.

A semiconductor material to be spin-dried set on table 3 is supported on support members 12 and held at its outer periphery with holding members 13. When the table 3 with shaft 1 rotates, weight 16 is shifted radially outwards due to centrifugal force against the resilient force of spring 17 as shown in FIGS. 5 and 6, whereby chuck member 11 is rotated, preferably 90°, to thereby hold peripheral portions of the supported material by chuck part 15 as shown in FIGS. 5 and 7. When the rotation ceases, the respective chuck members 11 are restored to the initial non-chuck position by means of spring 17.

Figure 8:
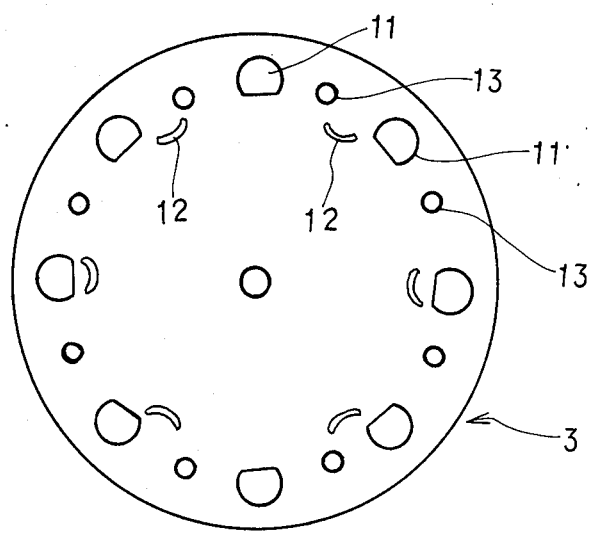
FIG. 8 is a top plan view showing another embodiment of the invention.
Figure 9:
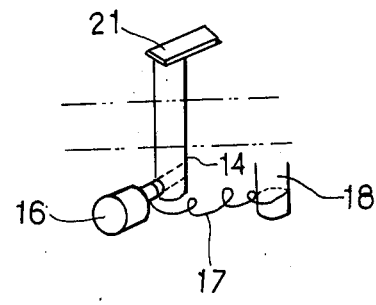
FIG. 9 is a perspective view showing another chuck member.

Although support member 12 is formed of a pin, it can be of other forms, for example, an arcuate shaped piece as shown in FIG. 8. Also, chuck part 15 will be of a form other than the described disk with a notch, and thus, for example, of a horizontal projection 21 provided on the top of the throughpin 14 as shown in FIG. 9. This projection 21 will be oriented tangentially to a imaginery circle passing through the respective chuck members 11 in a stopped condition, and oriented to the center of table 3 by a radially outward displacement of weight 16 due to centrifugal force in rotation.

As described above, in a spin drier of the invention, a semiconductor material to be dried is automatically held by a centrifugal force. Therefore, this apparatus provides a considerably easy setting and removal of a semiconductor material. Additionally, both surfaces of a material are spin-dried simultaneously, and mechanism as well as operation are simplified to thereby effect a spin-drying of a semiconductor material.

Having now fully described the invention, it will be apparent to one of ordinary skill in the art that many changes and modifications can be made thereto without departing from the spirit or scope of the invention as set forth herein.

What is claimed is:

1. A spin drier for semiconductor material, which comprises;
   a vertical shaft rotatably mounted within a housing;
   a horizontal rotary table located on the top of the shaft;
   support members positioned in the table and upwardly projecting from the table surface for supporting thereon semiconductor material;
   holding members to be contacted with the outer periphery of semiconductor material supported on the table;
   three or more chuck members for holding upper surface portions of the outer periphery of the support semiconductor material;
   each of said chuck members comprising a pin which passes through the table, a chuck part mounted on the top of said pin which during rotation of the table passes over the top of the supported semiconductor material, thereby holding the semiconductor material against any rise thereof, a weight eccentrically attached to said pin under the table, and a spring member for restoring said chuck part during non-rotation of the table to a determined angular position where said chuck part does not pass over the top of the semiconductor material.

2. A spin drier for semiconductor material as claimed in claim 1, wherein said chuck members are equally spaced and located in the peripheral portion of the table.

3. A spin drier for semiconductor material as claimed in claim 1, wherein each of said support member is a pin.

4. A spin drier for semiconductor material as claimed in claim 1, wherein each of said holding members is a pin.

5. A spin drier for semiconductor material as claimed in claim 1, wherein said weight is mounted on a free end of a pin which is perpendicularly attached to said pin passing through the table.

6. A spin drier for semiconductor material set forth in claim 1, further comprising a stopper for fixing said determined position of said chuck part.

7. A spin drier for semiconductor material as claimed in claim 1, wherein said chuck part is of elongated rectanglar shape whose long axis is essentially aligned with the radial axis of the table during the rotation of the table, and whose short axis is essentially aligned with the radial axis of the table during non-rotation of the table.

8. A spin drier for semiconductor material, which comprises;
   a vertical shaft rotatably mounted within a housing;
   a horizontal rotary table located on the top of the shaft;
   support members positioned in the table and upwardly projecting from the table surface for supporting thereon a semiconductor material;
   holding members to be contacted with the outer periphery of semiconductor material supported on the table;
   three or more chuck members for holding upper surface portions of the outer periphery of the supported semiconductor material;
   each of said chuck members comprising a pin which passes through the table, a chuck part comprising a disk formed with a chordal shaped notch mounted on the top of said pin for holding the supported semiconductor material against any rise thereof, a weight eccentrically attached to said pin under the table, and a spring member for restoring said chuck part during non-rotation of the table to a determined angular position where said chuck part does not hold semiconductor material.

* * * * *

UNITED STATES PATENT OFFICE
CERTIFICATE OF CORRECTION

PATENT NO. : 4,677,758

DATED : July 7, 1987

INVENTOR(S) : Seiichiro AIGO

It is certified that error appears in the above-identified patent and that said Letters Patent are hereby corrected as shown below:

Column 2, line 66, change "15" to --14--

Column 4, lines 2-3, change "support" to --supported--.

Signed and Sealed this

Twenty-second Day of March, 1988

Attest:

DONALD J. QUIGG

Attesting Officer

Commissioner of Patents and Trademarks